United States Patent
Wang et al.

(10) Patent No.: US 10,854,741 B2
(45) Date of Patent: Dec. 1, 2020

(54) ENHANCED HFET

(71) Applicant: THE 13TH RESEARCH INSTITUTE OF CHINA ELECTRONICS TECHNOLOGY GROUP CORPORATION, Hebei (CN)

(72) Inventors: Yuangang Wang, Shijiazhuang (CN); Zhihong Feng, Shijiazhuang (CN); Yuanjie Lv, Shijiazhuang (CN); Xin Tan, Shijiazhuang (CN); Xubo Song, Shijiazhuang (CN); Xingye Zhou, Shijiazhuang (CN); Yulong Fang, Shijiazhuang (CN); Guodong Gu, Shijiazhuang (CN); Hongyu Guo, Shijiazhuang (CN); Shujun Cai, Shijiazhuang (CN)

(73) Assignee: THE 13TH RESEARCH INSTITUTE OF CHINA ELECTRONICS, Hebei (CN)

( * ) Notice: Subject to any disclaimer, the term of this patent is extended or adjusted under 35 U.S.C. 154(b) by 0 days.

(21) Appl. No.: 16/610,207

(22) PCT Filed: Dec. 11, 2017

(86) PCT No.: PCT/CN2017/115427
§ 371 (c)(1),
(2) Date: Nov. 1, 2019

(87) PCT Pub. No.: WO2018/201721
PCT Pub. Date: Nov. 8, 2018

(65) Prior Publication Data
US 2020/0075754 A1 Mar. 5, 2020

(30) Foreign Application Priority Data
May 4, 2017 (CN) .......................... 2017 1 0308243

(51) Int. Cl.
H01L 29/778 (2006.01)
H01L 29/423 (2006.01)

(52) U.S. Cl.
CPC .... *H01L 29/7786* (2013.01); *H01L 29/42316* (2013.01)

(58) Field of Classification Search
CPC ...................... H01L 29/7786; H01L 29/42316
(Continued)

(56) References Cited

U.S. PATENT DOCUMENTS 8,937,338 B2 * 1/2015 Chowdhury .......... H01L 29/861
257/194
10,270,436 B2 * 4/2019 Chen .................... H01L 33/0033
(Continued)

FOREIGN PATENT DOCUMENTS

CN     101252088 A    8/2008
CN     101969071 A    2/2011
(Continued)

OTHER PUBLICATIONS

International Search Report and English translation of the International Search Report in the international application No. PCT/CN2017/115427, dated Mar. 16, 2018, 6 pages.
(Continued)

*Primary Examiner* — Igwe U Anya
(74) *Attorney, Agent, or Firm* — Cooper Legal Group, LLC

(57) ABSTRACT

An enhanced HFET, comprising a HFET device body. Regions without two-dimensional electron gas are provided on a channel layer (2) at the portion between a drain electrode (6) and a source electrode (4) of the HFET device body, and there is a region without two-dimensional electron gas provided on the channel layer (2) at the portions excluding the area under a gate electrode (5); two-dimensional
(Continued)

electron gas regions are provided on the channel layer (2) excluding the portions located between the drain electrode (6) and the source electrode (4) and provided with the regions without two-dimensional electron gas; the channel layer (2) at the portion between the gate electrode (5) and the source electrode (4) and the portion between the gate electrode (5) and the drain electrode (6) are each provided with a two-dimensional electron gas region; and two-dimensional electron gas (8) is provided at a portion or whole portion of a two-dimensional electron gas layer at the channel layer (2) at the portion right under the gate electrode (5). The HFET has the advantages of high saturation current, high threshold voltage controllability, fast response, low energy consumption, and the like.

10 Claims, 5 Drawing Sheets

(58) Field of Classification Search
USPC .......................................................... 257/194
See application file for complete search history.

(56) References Cited

U.S. PATENT DOCUMENTS

| | | |
|---|---|---|
| 10,741,682 B2 * | 8/2020 | Jeon ...................... H01L 29/872 |
| 2011/0121314 A1 | 5/2011 | Suh |
| 2016/0087089 A1 | 3/2016 | Prechtl et al. |
| 2017/0338810 A1 * | 11/2017 | Chen ....................... H01L 27/15 |
| 2018/0254326 A1 * | 9/2018 | Dong ................. H01L 29/7781 |

FOREIGN PATENT DOCUMENTS

| | | |
|---|---|---|
| CN | 102130160 A | 7/2011 |
| CN | 103715256 A | 4/2014 |
| CN | 104538440 A | 4/2015 |
| CN | 106531789 A | 3/2017 |
| CN | 206116406 U | 4/2017 |
| CN | 107093629 A | 8/2017 |

OTHER PUBLICATIONS

Written Opinion and English translation of the Written Opinion of the International Search Authority in the international application No. PCT/CN2017/115427, dated Mar. 16, 2018, 9 pages.
Cai, et al., "High-Performance Enhancement-Mode AlGaN/GaN HFETs Using Fluoride-Based Plasma Treatment", IEEE Electron Device Letters, 2005, 26(7), pp. 435-437, 4 pages.
Development and Characteristic Analysis of Enhancement-mode AlGaN/GaN Trench HFET, Yue Hao, Chong Wang, Jinyu Ni, Qian Feng, Jincheng Zhang, and Wei Mao, Science in China Series E, 39 (1). 2009, pp. 119-123, in which, a threshold voltage of a device is boosted from -2.2V to 0.47V with a technology of grooving under a gate, 6 pages.
Simulation Model Development and Verification for High Voltage GaN HFET in Cascode Structure. Energy Conversion Congress and Exposition, Zhengyang Liu, Xiucheng Huang, Fred C. Lee, and Qiang Li. ECCE, IEEE, 2013, pp. 3537-3594, in which an enhancement-mode Cascode GaN HFET is disclosed, a threshold of the GaN HFET is controlled by means of a Si device in the structure, 9 pages.

* cited by examiner

ENHANCED HFET

TECHNICAL FIELD

The disclosure relates to the technical field of semiconductor switch devices, in particular to an enhancement-mode hetero-structure field effect transistor (HFET).

BACKGROUND

Reference 1: *High-Performance Enhancement-Mode AlGaN/GaN HFETs Using Fluoride-Based Plasma Treatment. IEEE Electron Device Letters*, Yong Cai, Yugang Zhou, Kevin J. Chen, and Kei May Lau., 2005, 26(7), pp. 435-437, in which, a threshold voltage of a device is transferred by adopting F plasma treatment, the threshold voltage of the device is boosted from −4V to 0.9V, and an enhancement-mode device is implemented.

Reference 2: *Development and Characteristic Analysis of Enhancement-mode AlGaN/GaN Trench HFET*, Yue Hao, Chong Wang, Jinyu Ni, Qian Feng, Jincheng Zhang, and Wei Mao, Science in China Series E, 39 (1), 2009, pp. 119-123, in which, a threshold voltage of a device is boosted from −2.2V to 0.47V with a technology of grooving under a gate.

Reference 3: *Simulation Model Development and Verification for High Voltage GaN HFET in Cascode Structure. Energy Conversion Congress and Exposition*, Zhengyang Liu, Xiucheng Huang, Fred C. Lee, and Qiang Li. ECCE, IEEE, 2013, pp. 3587-3594, in which an enhancement-mode Cascode GaN HFET is disclosed, a threshold of the GaN HFET is controlled by means of a Si device in the structure.

At present, all the enhancement-mode HFETs based on Group III nitride materials adopt a planar channel layer, and the enhancement is implemented by grooving, injecting F plasmas and cascading with the Si device (as illustrated in FIG. 1). The grooving process causes a large damage to a gate interface. The grooving process without damage is difficult to implemented, and the threshold changes significantly with the depth of the groove. The injection of F plasmas is instable, and the switch characteristic of a cascade structure is limited by the Si device.

SUMMARY

Technical Problems

The technical problem to be solved by the disclosure is how to provide an enhancement-mode HFET with high saturation current and a controllable enhancement threshold.

Technical Solutions

To solve the above technical problem, the technical solution adopted by the disclosure is an enhancement-mode HFET, which includes a HFET device body. A region without two-dimensional electron gas is provided on a channel layer between a drain electrode and a source electrode of the HFET device body, and the region without two-dimensional electron gas is provided on the channel layer except the area under a gate electrode. Regions with two-dimensional electron gas is provided on the channel layer, except the region without two-dimensional electron gas, between the drain electrode and the source electrode, and regions with the two-dimensional electron gas are provided on both the channel layer between the gate electrode and the source electrode and the channel layer between the gate electrode and the drain electrode. The channel layer right under the gate electrode is partially or all provided with two-dimensional electron gas at a two-dimensional electron gas layer.

In a further technical solution, the number of regions without two-dimensional electron gas is more than one.

In a further technical solution, a width range of each region without two-dimensional electron gas is greater than or equal to 1 nm and less than or equal to 10 μm.

In a further technical solution, a width range of each region without two-dimensional electron gas is greater than or equal to 50 nm and less than or equal to 800 nm.

In a further technical solution, the number of the gate electrodes is an integer more than or equal to 1.

In a further technical solution, the number of the gate electrodes is an integer more than 1, and the gate electrodes have a same length or different lengths.

In a further technical solution, the gate electrodes are one or a combination of a straight gate, a T-shaped gate, a TT-shaped gate, a TTT-shaped gate, a V-shaped gate, a U-shaped gate and a Y-shaped gate.

In a further technical solution, when one gate electrode is provided on the HFET device, an insulating medium layer is provided between a gate root at the lower side of the gate electrode and a barrier layer, or no insulating medium layer is provided between a gate root at the lower side of the gate electrode and a barrier layer. When more than two gate electrodes are provided on the HFET device, an insulating medium layer is provided between the gate root at the lower side of a part of the gate electrodes and the barrier layer, and no insulating medium layer is provided between the gate root at the lower side of a part of the gate electrodes and the barrier layer. Alternatively, an insulating medium layer is provided between the gate root at the lower side of all of the gate electrodes and the barrier layer, or, no insulating medium layer is provided between the gate root at the lower side of all of the gate electrodes and the barrier layer.

In a further technical solution, the HFET device body includes a substrate. A channel layer is provided on an upper surface of the substrate layer, a source electrode is provided at a left side of the upper surface of the channel layer, and a drain electrode is provided at a right side of the upper surface of the channel layer. A barrier layer is provided on the upper surface, between the source electrode and the drain electrode, of the channel layer. More than one gate electrodes are provided on the upper surface of the barrier layer. A passivation layer is provided on the upper surface, except a region where the gate electrode is arranged, of the barrier layer. An insulating medium layer is provided between a gate root at a lower side of the gate electrode and the barrier layer, or no insulating medium layer is provided between a gate root at a lower side of the gate electrode and the barrier layer.

In a further technical solution, a part of the upper surface of the barrier layer is further provided with a P-type cap layer, which is used for forming the region without two-dimensional electron gas.

Beneficial effects of the disclosure

The beneficial effects generated by adopting the above technical solutions include the followings. A region without two-dimensional electron gas is provided on a channel layer between a drain electrode and a source electrode of the HI-BT device body, and the region without two-dimensional electron gas is a two-dimensional electron gas barrier region. As a forward voltage of the gate electrode increases, the barrier width and height decrease continuously. When the device is switched on, electron tunneling may happen in the region without two-dimensional electron gas (2DEG), and the saturation current is high. The barrier height of the region without 2DEG has a small influence on the threshold voltage of the device, which improve controllability for the threshold. Due to the controllable threshold, the device can be applied to a power electronic device and a digital circuit, so as to improve the speed and reduce power consumption. The device may be switched on or off only by controlling a small amount of electrons of the region without 2DEG to charge or discharge, which improves a switching speed. When the device is switched on, the width of the region without 2DEG has a great influence on the threshold voltage, and a threshold voltage can be controllable in an ultra-wide range.

Here, 1 represents a barrier layer; 2 represents a channel layer; 3 represents a substrate; 4 represents a source electrode; 5 represents a gate electrode; 6 represents a drain electrode; 7 represents a passivation layer; 8 represents two-dimensional electron gas; 9 represents an insulating medium layer; 10 represents a P-type cap layer; 11 represents a conduction band; and 12 represents electron tunneling.

DETAILED DESCRIPTION

The technical solutions of the disclosure are described clearly and completely below in combination with the drawings. Apparently, the described embodiments are merely a part, rather than all, of the embodiments of the disclosure. On the basis of the embodiments of the disclosure, all other embodiments obtained by those skilled in the art without creative work fall within the protection scope of the disclosure.

A lot of details are described in the following description to fully understand the disclosure, but the disclosure may also be implemented by other ways different from that described here. Those skilled in the art may make the similar promotions without departing from the connotation of the disclosure, and the disclosure is not limited to the specific embodiments disclosed below.

First Embodiment

Figure 1:
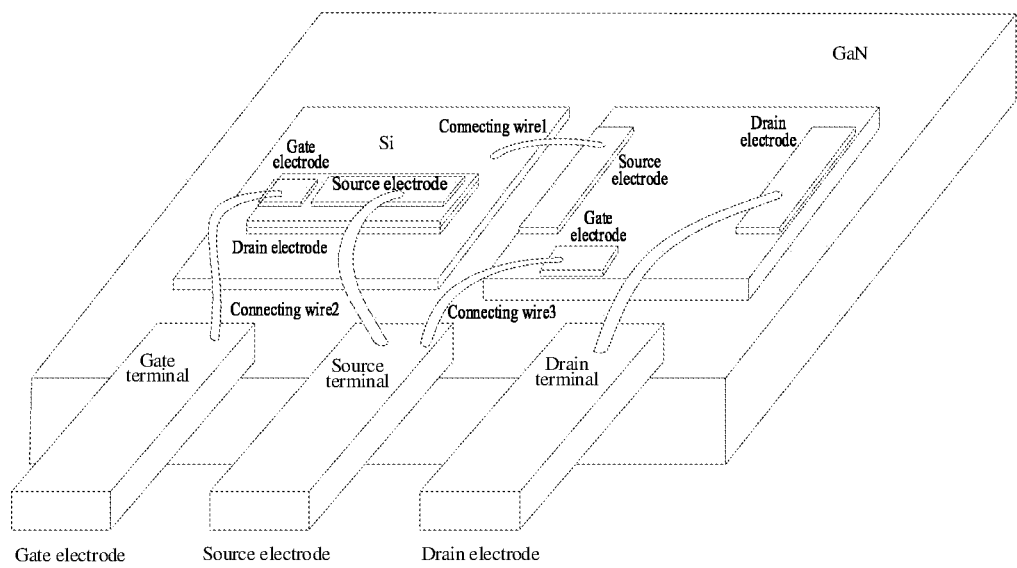
FIG. 1 is a three-dimensional schematic structural diagram of a Cascode GaN HFET in the conventional art.
Figure 2:
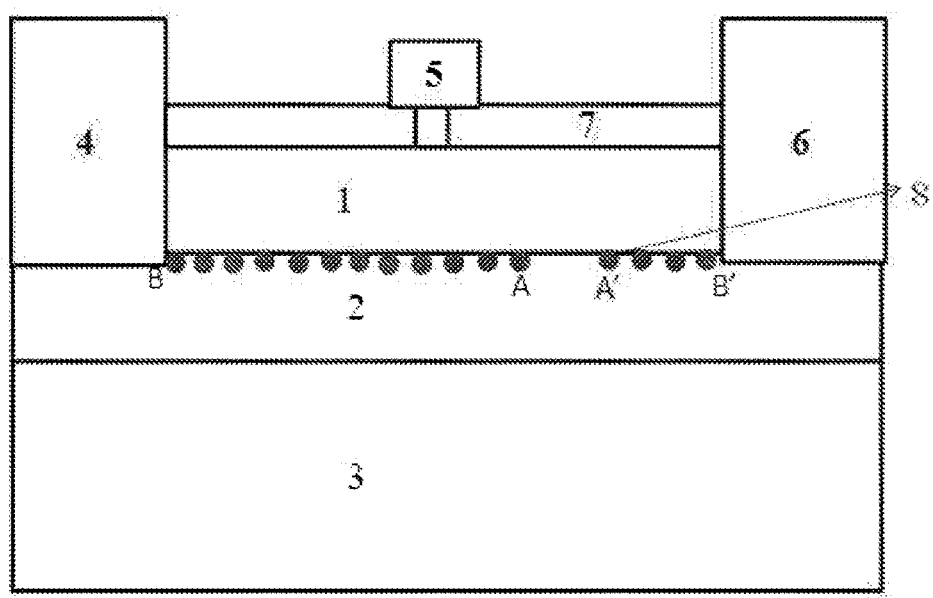
FIG. 2 is a schematic structural diagram of an enhancement-mode HFET according to the first embodiment of the disclosure.

As illustrated in FIG. 2, the embodiments of the present disclosure provide an enhancement-mode HFET, which includes a HFET device body. The HFET device body includes a substrate 1. A channel layer 2 is provided on an upper surface of the substrate 1. A source electrode 4 is provided at the left side of an upper surface of the channel layer 2. A drain electrode 6 is provided at the right side of the upper surface of the channel layer 2. A barrier layer 1 is provided on an upper surface, between the source electrode 4 and the drain electrode 6, of the channel layer, and a two-dimensional electron gas (2DEG) layer is formed on the channel layer 2 below the barrier layer 1. A region (a region from A to A' in FIG. 2) without two-dimensional electron gas is provided on the channel layer 2 between the drain electrode 6 and the source electrode 4, and a region with two-dimensional electron gas is provided on the channel layer 2, except the region without two-dimensional electron gas, between the drain electrode 6 and the source electrode 4. That is, the two-dimensional electron gas layer is discontinuous, and is divided into two regions (the region from B to A and the region from A' to B' in FIG. 2) with two-dimensional electron gas including a left region with two-dimensional electron gas and a right region with two-dimensional electron gas by the region without two-dimensional electron gas. A gate electrode 5 is provided on an upper surface of the barrier layer. The gate electrode 5 is a T-type gate. A passivation layer 7 is provided on the upper surface, except a region where the gate electrode 5 is arranged, of the barrier layer 1. The channel layer right under the gate electrode 5 is provided with two-dimensional electron gas at the two-dimensional electron gas layer.

The region without two-dimensional electron gas is provided on the channel layer between the drain electrode and the source electrode of the HFET device body, and the region is the two-dimensional electron gas barrier region. As a forward voltage of the gate electrode increases, the barrier width and height decrease continuously. When the device is switched on, electron tunneling may happen in the region without two-dimensional electron gas (2DEG), and the saturation current is high. The barrier height of the region without 2DEG has a small influence on the threshold voltage of the device, which improve controllability for the threshold. Due to the controllable threshold, the device can be applied to a power electronic device and a digital circuit, so as to improve the speed and reduce power consumption. The device may be switched on or off only by controlling a small amount of electrons of the region without 2DEG to charge or discharge, which improve a switching speed. When the device is switched on, the width of the region without 2DEG has a great influence on the threshold voltage, and a threshold voltage can be controllable in an ultra-wide range.

Figure 7:
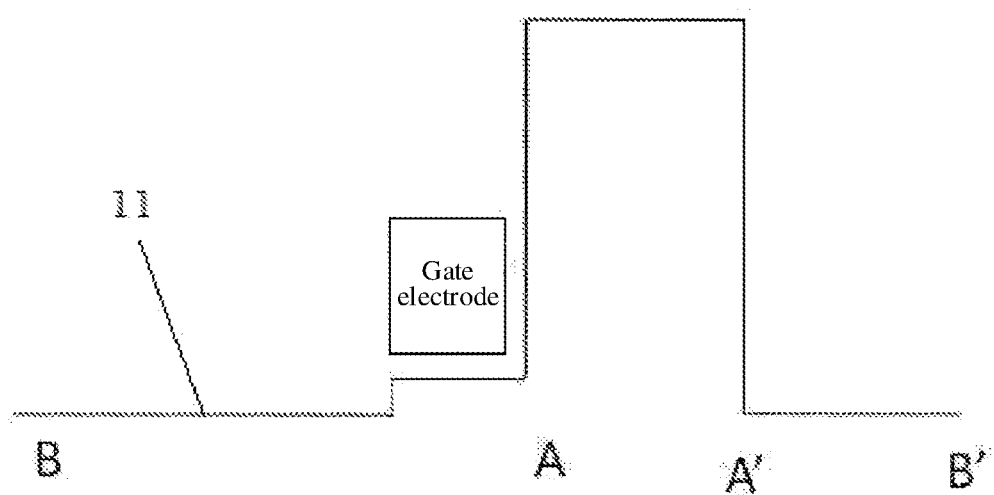
FIG. 7 is a schematic diagram of a conduction band at the interface of a barrier layer/a channel layer when a gate voltage of the enhancement-mode HFET is equal to 0V according to the first embodiment of the disclosure.
Figure 8:
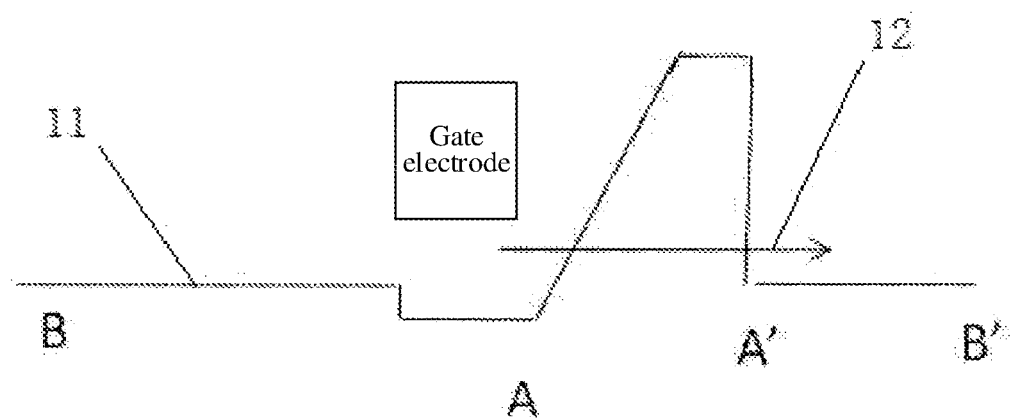
FIG. 8 is a schematic diagram of the conduction band at the interface of the barrier layer/the channel layer when the gate voltage of the enhancement-mode HFET is greater than a threshold voltage which is greater than 0V according to the first embodiment of the disclosure.

FIG. 7 is a schematic diagram of a conduction band at the interface of the barrier layer/the channel layer when a gate voltage of the enhancement-mode HFET is equal to 0V according to the first embodiment of the disclosure. FIG. 8 is a schematic diagram of the conduction band at the interface of the barrier layer/the channel layer when the gate voltage of the enhancement-mode HFET is greater than a threshold voltage which is greater than 0V according to the first embodiment of the disclosure. The barrier height and width decrease with the increase of a positive gate voltage, and a possibility of the electronic tunneling increases with the decrease of the barrier height and width.

Second Embodiment

Figure 3:
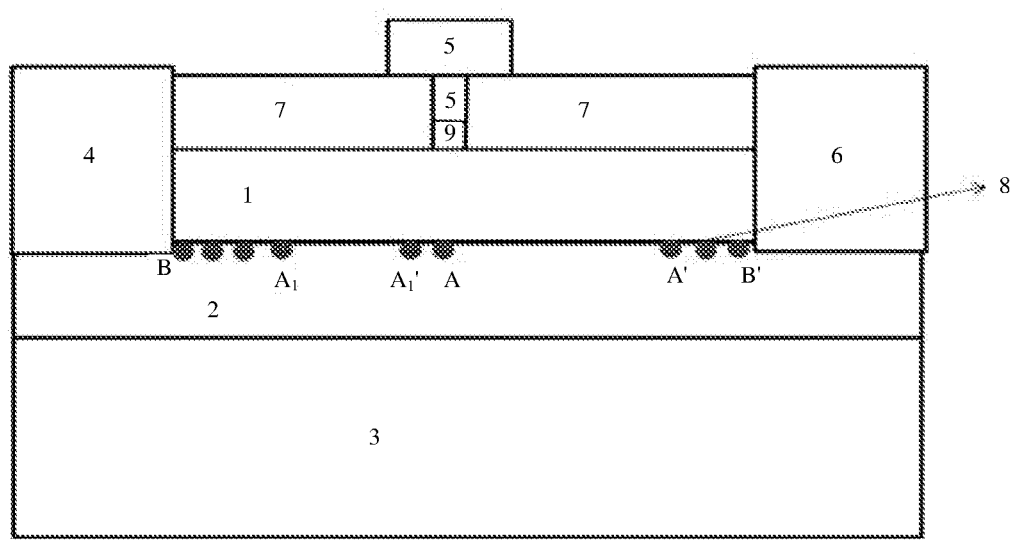
FIG. 3 is a schematic structural diagram of an enhancement-mode single-gate GaN HFET prepared by a fluorine treatment process according to the second embodiment of the disclosure.

As illustrated in FIG. 3, the embodiments of the present disclosure provide an enhancement-mode HFET, which includes a HFET device body. The HFET device body includes a substrate 1. A channel layer 2 is provided on an upper surface of the substrate 1. A source electrode 4 is provided at the left side of the upper surface of the channel layer 2. A drain electrode 6 is provided at the right side of the upper surface of the channel layer 2. A barrier layer 1 is provided on an upper surface, between the source electrode 4 and the drain electrode 6, of the channel layer, and a two-dimensional electron gas (2DEG) layer is formed on the channel layer 2 below the barrier layer 1. Two regions (the region from $A_1$ to $A_1'$ and the region from A to A' in FIG. 3) without two-dimensional electron gas are provided on the channel layer 2 between the drain electrode 6 and the source electrode 4. The region without 2DEG is formed by injecting fluorine ions.

A region with two-dimensional electron gas is provided on the channel layer 2, except the region without two-dimensional electron gas, between the drain electrode 6 and the source electrode 4. That is, the two-dimensional electron gas layer is discontinuous, and is divided into three regions (the region from B to $A_1$, the region from $A_1'$ to A, and the region from A' to B' in FIG. 3) with two-dimensional electron gas by the region without two-dimensional electron gas. An insulating medium layer 9 is provided on a part of the upper surface of the barrier layer. A T-type gate electrode is provided on the upper surface of the insulating medium layer 9. A passivation layer 7 is provided on the upper surface, except a region where the gate electrode 5 is arranged, of the barrier layer 1. The channel layer right under the gate electrode 5 is all provided with the two-dimensional electron gas at the two-dimensional electron gas layer.

Third Embodiment

Figure 4:
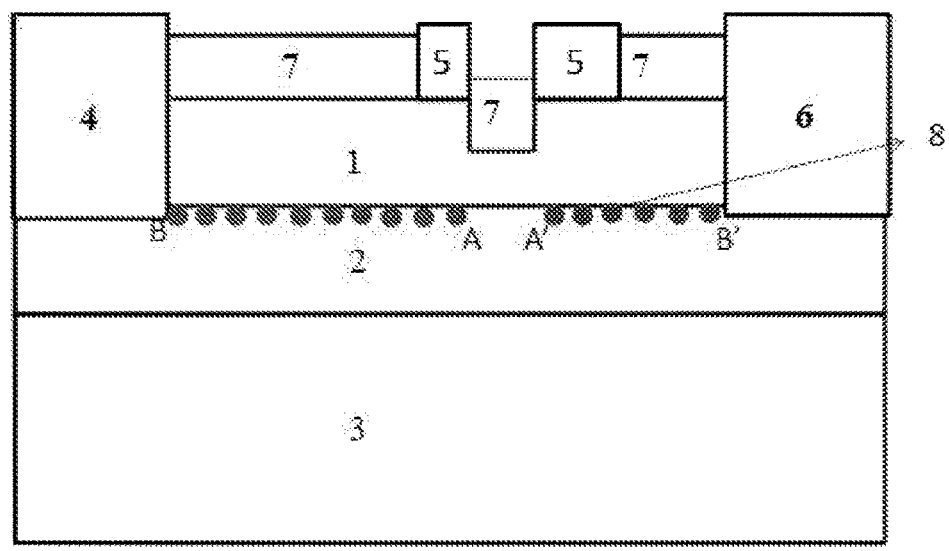
FIG. 4 is a schematic structural diagram of a groove enhancement-mode dual-gate GaN HFET according to the third embodiment of the disclosure.

As illustrated in FIG. 4, the embodiments of the present disclosure provide an enhancement-mode HFET, which includes a HFET device body. The HFET device body includes a substrate 1. A channel layer 2 is provided on an upper surface of the substrate 1. A source electrode 4 is provided at the left side of the upper surface of the channel layer 2. A drain electrode 6 is provided at the right side of the upper surface of the channel layer 2. A barrier layer 1 is provided on the upper surface, between the source electrode 4 and the drain electrode 6, of the channel layer, and a two-dimensional electron gas (2DEG) layer is formed on the channel layer 2 below the barrier layer 1. One region (a region from A to A' in FIG. 4) without two-dimensional electron gas is provided on the channel layer 2 between the drain electrode 6 and the source electrode 4. The region without 2DEG is formed by etching the barrier layer 1.

A region with two-dimensional electron gas is provided on the channel layer 2, except the region without two-dimensional electron gas, between the drain electrode 6 and the source electrode 4. That is, the two-dimensional electron gas layer is discontinuous, and is divided into two regions (the region from B to A and the region from A' to B' in FIG. 4) with two-dimensional electron gas by the region without two-dimensional electron gas. Two gate electrodes 5 are provided on a part of the upper surface of the barrier layer 1. The gate electrodes 5 are straight gates, and have different widths. A passivation layer 7 is provided on the upper surface, except a region where the gate electrodes 5 are arranged, of the barrier layer 1, and the passivation layer 7 between the gate electrode 5 and the gate electrode 5 is embedded in the etched groove of the barrier layer 1. The channel layer right under the gate electrode 5 is provided with the two-dimensional electron gas at the two-dimensional electron gas layer.

Fourth Embodiment

Figure 5:
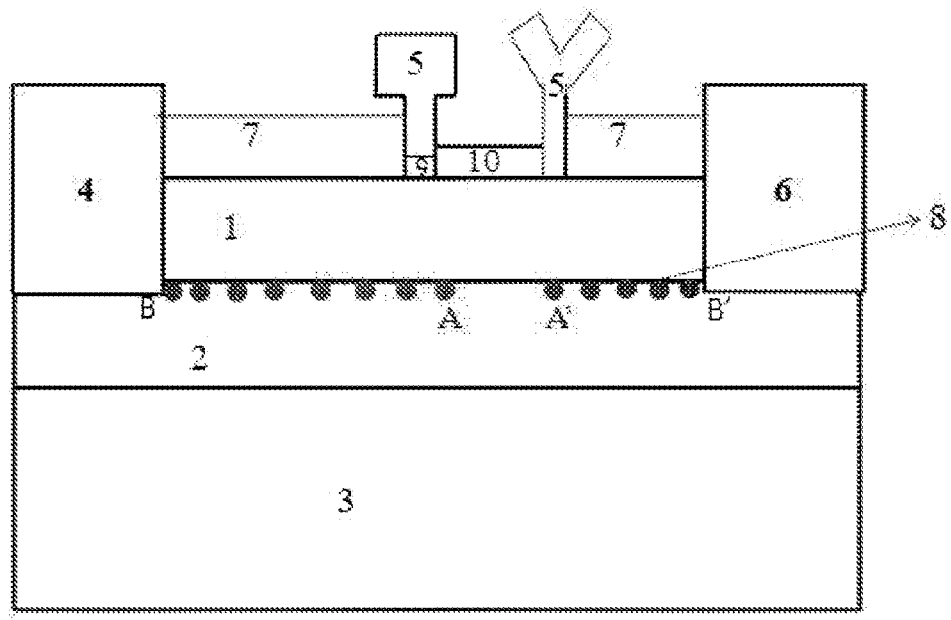
FIG. 5 is a schematic structural diagram of a groove enhancement-mode dual-gate GaN HFET according to the fourth embodiment of the disclosure.

As illustrated in FIG. 5, the embodiments of the present disclosure provide an enhancement-mode HFET, which includes a HFET device body. The HFET device body includes a substrate 1. A channel layer 2 is provided on an upper surface of the substrate 1. A source electrode 4 is provided at the left side of the upper surface of the channel layer 2. A drain electrode 6 is provided at the right side of the upper surface of the channel layer 2. A barrier layer 1 is provided on the upper surface, between the source electrode 4 and the drain electrode 6, of the channel layer, and a two-dimensional electron gas (2DEG) layer is formed on the channel layer 2 below the barrier layer 1. A region (the region from A to A' in FIG. 5) without two-dimensional electron gas is provided on the channel layer 2 between the drain electrode 6 and the source electrode 4. The region without 2DEG is formed by self-exhaustion of the P-type cap layer 10.

A region with two-dimensional electron gas is provided on the channel layer 2, except the region without two-dimensional electron gas, between the drain electrode 6 and the source electrode 4. That is, the two-dimensional electron gas layer is discontinuous, and is divided into two regions (the region from B to A and the region from A' to B' in FIG. 5) with two-dimensional electron gas by the region without two-dimensional electron gas. Two gate electrodes 5 are provided on a part of the upper surface of the barrier layer 1. The gate electrodes 5 are a T-type or Y-type gate. The P-type cap layer 10 is provided on the upper surface of the barrier layer 1 between two gate electrodes 5. A passivation layer 7 is provided on the upper surface, except a region between the two gate electrodes 5, of the barrier layer 1. The channel layer right under one of the two gate electrodes 5 is all provided with the two-dimensional electron gas at the two-dimensional electron gas layer, and the channel layer right under the other gate electrode 5 is partially provided with the two-dimensional electron gas at the two-dimensional electron gas layer.

Fifth Embodiment

Figure 6:
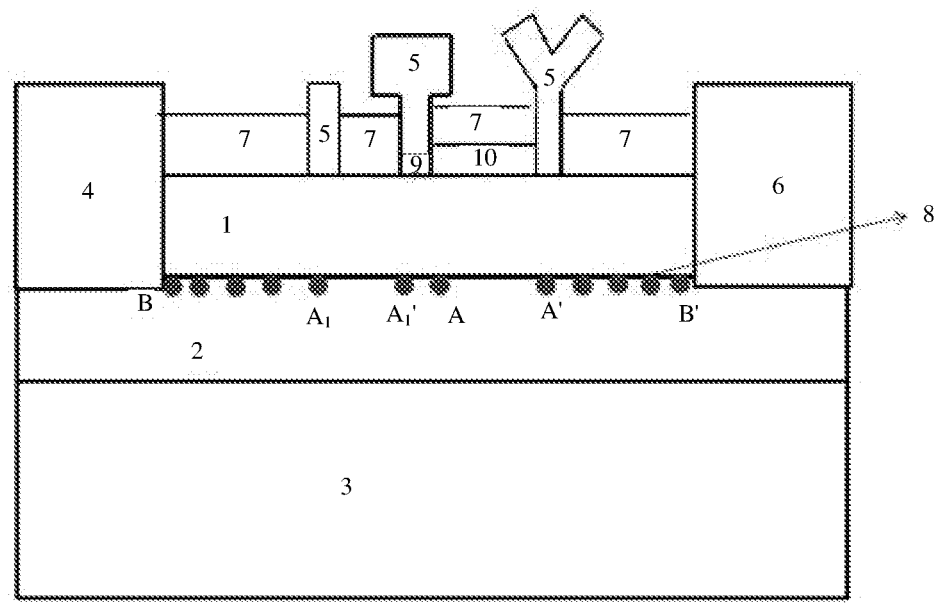
FIG. 6 is a schematic structural diagram of a groove enhancement-mode tri-gate GaN HFET according to the fifth embodiment of the disclosure.

As illustrated in FIG. 6, the embodiments of the present disclosure provide an enhancement-mode HFET, which includes a HFET device body. The HFET device body includes a substrate 1. A channel layer 2 is provided on an upper surface of the substrate 1. A source electrode 4 is provided at the left side of the upper surface of the channel layer 2. A drain electrode 6 is provided at the right side of the upper surface of the channel layer 2. A barrier layer 1 is provided on the upper surface, between the source electrode 4 and the drain electrode 6, of the channel layer, and a two-dimensional electron gas (2DEG) layer is formed on the channel layer 2 below the barrier layer 1. Two regions (the region from $A_1$ to $A_1'$ and the region from A to A' in FIG. 6) without two-dimensional electron gas are provided on the channel layer 2 between the drain electrode 6 and the source electrode 4. The two regions without two-dimensional electron gas are formed in different ways. The region from A to A' is formed by self-exhaustion of the P-type cap layer 10, and the region from $A_1$ to $A_1'$ is formed by processing the fluorine ions.

The region with two-dimensional electron gas is provided on the channel layer 2, except the regions without two-dimensional electron gas, between the drain electrode 6 and the source electrode 4. That is, the two-dimensional electron gas layer is discontinuous, and is divided into three regions (the region from B to $A_1$, the region from $A_1'$ to A, and the region from A' to B' in FIG. 6) with two-dimensional electron gas by the regions without two-dimensional electron gas. Two gate electrodes 5, an insulating medium layer 9 and a P-type cap layer 10 are provided on a part of the upper surface of the barrier layer 1. One gate electrode 5 is provided on the upper surface of the insulating medium layer 9. The three gate electrodes are respectively a straight gate, a T-type gate and a Y-type gate. Passivation layers are provided on the upper surface, except the regions where the gate electrodes 5 are arranged, of the barrier layer 1 and the upper surface of the P-type cap layer 10. The channel layer right under the gate electrode 5 is all provided with the two-dimensional electron gas at the two-dimensional electron gas layer.

It is to be noted that in the first embodiments to the fifth embodiment, the width range of each region without 2DEG is greater than or equal to 1 nm and less than or equal to 10 μm, and a preferable range is greater than or equal to 50 nm and less than or equal to 800 nm. Moreover, according to the description of the above embodiments, those skilled in the art may also make some apparent changes. For example, the region without 2DEG is formed in other ways except the ways presented in the disclosure. The barrier layer 1 is made of one-layer or multilayer composite material. The channel layer 2 is made of the multilayer composite material, and is in structures of back barrier, multilayer buffer, and so on. The substrate is made of SiC, Si, diamond, sapphire, GaN, and so on, or is made of multilayer composite material. An epitaxial layer directly extends to the substrate or is transferred to other substrates. The gate is in the shapes except that presented in the disclosure, and the insulating medium is single medium or composite medium. All the changes shall fall within the protection scope of the claims of the disclosure.

The invention claimed is:

1. An enhancement-mode hetero-structure field effect transistor (HFET), comprising a HFET device body, wherein
   a region without two-dimensional electron gas is provided on a channel layer between a drain electrode and a source electrode of the HFET device body,
   the region without two-dimensional electron gas is provided on the channel layer except an area under a gate electrode,
   regions with two-dimensional electron gas are provided on the channel layer, except the region without two-dimensional electron gas, between the drain electrode and the source electrode,
   the regions with two-dimensional electron gas are provided on both the channel layer between the gate electrode and the source electrode and the channel layer between the gate electrode and the drain electrode, respectively, and
   the channel layer right under the gate electrode is partially or all provided with two-dimensional electron gas at a two-dimensional electron gas layer.

2. The enhancement-mode HFET of claim 1, wherein a number of regions without two-dimensional electron gas is more than one.

3. The enhancement-mode HFET of claim 1, wherein a width range of each region without two-dimensional electron gas is greater than or equal to 1 nm and less than or equal to 10 μm.

4. The enhancement-mode HFET of claim 3, wherein the width range of each region without two-dimensional electron gas is greater than or equal to 50 nm and less than or equal to 800 nm.

5. The enhanced HFET of claim 1, wherein a number of gate electrodes is an integer more than or equal to 1.

6. The enhancement-mode HFET of claim 1, wherein a number of gate electrodes is an integer more than 1, and the gate electrodes have a same length or different lengths.

7. The enhancement-mode HFET of claim 1, wherein the gate electrode is one or a combination of a straight gate, a T-shaped gate, a TT-shaped gate, a TTT-shaped gate, a V-shaped gate, a U-shaped gate and a Y-shaped gate.

8. The enhancement-mode HFET of claim 1, wherein
   when one gate electrode is provided on the HFET device body,
      an insulating medium layer is provided between a gate root at a lower side of the gate electrode and a barrier layer; or
      no insulating medium layer is provided between a gate root at a lower side of the gate electrode and a barrier layer, and
   when more than two gate electrodes are provided on the HFET device body,
      an insulating medium layer is provided between a gate root at a lower side of a part of the gate electrodes and a barrier layer, or no insulating medium layer is provided between the gate root at the lower side of the part of the gate electrodes and the barrier layer; or
      an insulating medium layer is provided between a gate root at a lower side of all of the gate electrodes and a barrier layer, or, no insulating medium layer is provided between the gate root at the lower side of all of the gate electrodes and the barrier layer.

9. The enhancement-mode HFET of claim 1, wherein the HFET device body comprises a substrate, the channel layer is provided on an upper surface of the substrate, the source electrode, is provided at a left side of an upper surface of the channel layer, the drain electrode is provided at a right side of the upper surface of the channel layer, a barrier layer is provided on the upper surface, between the source electrode and the drain electrode, of the channel layer, more than one gate electrode is provided on an upper surface of the barrier layer, a passivation layer is provided on the upper surface, except an area where the gate electrode is arranged, of the barrier layer, an insulating medium layer is provided between a gate root at a lower side of the gate electrode and the barrier layer, or no insulating medium layer is provided between a gate root at a lower side of the gate electrode and the barrier layer.

10. The enhancement-mode HFET of claim 9, wherein a part of the upper surface of the barrier layer is further provided with a P-type cap layer, which is used for forming the region without two-dimensional electron gas.

* * * * *

UNITED STATES PATENT AND TRADEMARK OFFICE
CERTIFICATE OF CORRECTION

PATENT NO. : 10,854,741 B2
APPLICATION NO. : 16/610207
DATED : December 1, 2020
INVENTOR(S) : Yuangang Wang et al.

Page 1 of 1

It is certified that error appears in the above-identified patent and that said Letters Patent is hereby corrected as shown below:

On the Title Page

Item (73) titled Assignee, Please delete:
"The 13th Research Institute of China Electronics"
And replace with:
The 13th Research Institute of China Electronics Technology Group Corporation Signed and Sealed this
Fourth Day of July, 2023

Katherine Kelly Vidal
*Director of the United States Patent and Trademark Office*